US006528399B1

(12) United States Patent
Alieu et al.

(10) Patent No.: US 6,528,399 B1
(45) Date of Patent: Mar. 4, 2003

(54) MOSFET TRANSISTOR WITH SHORT CHANNEL EFFECT COMPENSATED BY THE GATE MATERIAL

(75) Inventors: Jérôme Alieu, Isle d'Abeau (FR); Caroline Hernandez, Grenoble (FR); Michel Haond, Crolles (FR)

(73) Assignee: STMicroelectronics, S.A., Crolles (FR)

( * ) Notice: Subject to any disclaimer, the term of this patent is extended or adjusted under 35 U.S.C. 154(b) by 0 days.

(21) Appl. No.: 09/606,600

(22) Filed: Jun. 29, 2000

(30) Foreign Application Priority Data

Aug. 2, 1999 (FR) .............................. 99 08811

(51) Int. Cl.[7] .............................. H01L 21/22
(52) U.S. Cl. ........................ 438/561; 257/19
(58) Field of Search .................. 438/197, 561, 438/563, 564, 592, 304, 267, 595–596, 558, 542, 548, 488, 491; 257/407, 65–66, 382–385, 410–413, 742–743

(56) References Cited

U.S. PATENT DOCUMENTS

| 5,162,246 | A | * | 11/1992 | Ozturk et al. ................. 437/41 |
| 5,242,847 | A | * | 9/1993 | Ozturk et al. ................. 437/41 |
| 5,336,903 | A | * | 8/1994 | Ozturk et al. ................. 257/19 |
| 5,453,389 | A | * | 9/1995 | Strain et al. .................. 437/31 |
| 5,571,744 | A | * | 11/1996 | Demirlioglu et al. ......... 437/57 |
| 5,888,867 | A | | 3/1999 | Wang et al. ................. 438/257 |
| 6,281,559 | B1 | * | 8/2001 | Yu et al. ..................... 257/407 |
| 6,312,995 | B1 | * | 11/2001 | Yu ............................. 438/283 |
| 6,333,245 | B1 | * | 12/2001 | Furukawa et al. ........... 438/542 |

FOREIGN PATENT DOCUMENTS

| EP | 04072739 | 3/1992 | ......... H01L/21/336 |
| EP | 08340104 | 12/1996 | ........... H01L/29/78 |
| EP | 0 856 892 A2 | 8/1998 | ........... H01L/29/78 |
| EP | 0 889 504 A1 | 1/1999 | ........... H01L/21/28 |

* cited by examiner

Primary Examiner—David Nelms
Assistant Examiner—David Vu

(57) ABSTRACT

A MOSFET transistor comprising a gate made of silicon-germanium alloy, formed on a single crystal silicon substrate by means of a thin insulating layer, and drain and source regions implanted in the substrate on each side of the gate, characterized in that the gate comprises side regions presenting an increasing germanium percentage towards the sides of the gate facing the drain and source regions. Advantage: compensation of the short channel effect by locally decreasing the work function of the gate material near the drain and source regions.

10 Claims, 3 Drawing Sheets

MOSFET TRANSISTOR WITH SHORT CHANNEL EFFECT COMPENSATED BY THE GATE MATERIAL

BACKGROUND OF THE INVENTION

1. Technical Field

The present invention relates to a MOSFET transistor comprising a gate made of silicon-germanium alloy and formed on a single-crystal silicon substrate by means of a thin insulating layer and drain and source regions implanted in the substrate on each side of the gate.

2. Description of the Related Art

One of the major trends in microelectronics today is to reduce the length of the gates of MOSFET transistors below 0.25 micrometer without degrading the electrical characteristics of these transistors. Beside the various technological problems to be solved to achieve this object, the so-called "Short Channel Effect" or SCE effect has to be faced, due to space charge regions appearing in the PN junctions, which are present at the channel/drain and channel/source interfaces of the MOS transistors. These regions, emptied of free carriers, reduce the useful length of the channel and the number of carriers available for the inversion region under the gate. The shortening of the channel not being controlled by the gate creates consequences including a substantial decrease of the threshold voltage Vth and an increase of the OFF current, i.e. the leakage current of the transistors in the OFF state.

It is known in the prior art that a gate made of germanium or of a silicon-germanium alloy increases the threshold voltage Vth of MOS transistors, in particular PMOS transistors. For example, the Patent application FR-97-08457 in the name of the same applicant provides, to that effect, a method of forming a gate made of an alloy $Si_{1-x}Ge_x$ where "x" is above 50%.

In relation with FIG. 1, it is recalled that the threshold voltage of a MOS transistor indeed depends on the work function $\Phi$ of the gate material, whose expression is:

$$\Phi = E_G + \chi$$

With:

$$E_G = Ev - Ec$$

And:

$$\chi = E_0 - Ev$$

$E_G$ being the gap of the gate material, $\chi$ the electron affinity of the gate material, $E_0$ the energy level of the vacuum (free electron at rest), Ev the low limit and Ec the high limit of the gap.

The gap $E_G(Ge)$ of germanium, equal to 0.66 eV, being smaller than the gap $E_G(Si)$ of silicon, equal to 1.12 eV, the work function $\Phi(Ge)$ of germanium is smaller than the work function $\Phi(Si)$ of silicon. As the gate voltage is negative in a PMOS transistor, with regard to the substrate, the threshold voltage Vth of a transistor with a germanium gate is thus higher, in absolute value, than the threshold voltage Vth of a transistor with a silicon gate.

However, the providing of a gate made of germanium or germanium-silicon alloy brings only a relative advantage and does not allow the suppression of the short channel effect. To aid in better understanding, the graphs C1, C2, represented in FIG. 2, illustrate the variations of the threshold voltage Vth versus the length of the gate Lg, respectively, for a silicon gate and a germanium gate. The graph C2 of the transistors with a germanium gate, although being offset upwardly in absolute value compared to the graph C1 of the transistors with a silicon gate, presents the same decrease as the graph C1 when the length of the gate becomes less than 0.3 micrometer.

Within an integrated circuit, this rapid decrease of the graphs C1 and C2 below 0.3 micrometer involves a significant dispersion of the threshold voltages of transistors having different gate lengths. It also involves a dispersion of the threshold voltages of transistors having, theoretically, the same gate length, because of fabrication tolerances of the gates, typically in the order of 0.02 $\mu$m. Lastly, transistors with a short channel and a small threshold voltage present a current consumption which is not negligible in the OFF state, as already mentioned.

SUMMARY OF THE INVENTION

Thus, a general object of the present invention is to provide a means allowing the compensation of the short channel effect in MOS transistors with a small gate length.

A more specific object of the present invention is to provide a means allowing gradual compensation for the short channel effect, in a way inversely proportional to the length of the gate Lg of MOS transistors, so as to straighten the graph Vth=f(Lg) up to gate lengths on the order of 0.1 $\mu$m, or even less.

To that effect, the present invention provides a MOSFET transistor comprising a gate made of a silicon-germanium alloy, formed on a single crystal silicon substrate by means of a thin insulating layer, and drain and source regions implanted in the substrate on each side of the gate, wherein the gate comprises side regions presenting an increasing germanium percentage toward the edges of the gate facing the drain and source regions.

According to one embodiment, the gate comprises a silicon central region comprising no germanium or a constant percentage of germanium.

According to one embodiment, the side regions comprise a maximal germanium percentage ranging from 10 to 100% on the sides of the gate.

According to one embodiment, the transistor is of the PMOS type and comprises a P-type gate on a N-type substrate.

The present invention also relates to an integrated circuit comprising a plurality of transistors, according to the invention, and having gates of various lengths, wherein the side regions presenting an increasing germanium percentage are substantially of the same length, independent of the lengths of the gates, so that the gates with a smaller length comprise an average germanium percentage greater than the gates with a larger length.

The present invention also relates to a method of manufacturing a MOS transistor gate comprising an initial step of forming an initial gate made of silicon or silicon-germanium alloy with a small germanium percentage, the steps of depositing a germanium external layer at least on the sides of the gate, applying a thermal annealing cycle to the gate in order to diffuse germanium from the germanium external layer into the gate material, and removing the germanium external layer.

According to one embodiment, the step of depositing the germanium external layer is preceded by a step of depositing, at least on the sides of the gate, a thin layer of a protection material at least resistant to a solvent or an etching agent of the germanium external layer.

According to one embodiment, the protection material is silicon oxide.

According to one embodiment, the germanium external layer is removed according to one of the following processes: cleaning with water, cleaning with hydrogen peroxide, cleaning with sulphuric acid, removal by oxygen plasma, or a combination of these processes.

According to one embodiment, the initial gate is formed by etching a layer of gate material by means of a hard mask made of silicon oxide. The hard mask is left over the top of the gate during the germanium diffusion step, and the hard mask is removed from the gate after the germanium diffusion.

According to one embodiment, a further step of doping the gate by means of P-type dopant atoms is provided.

BRIEF DESCRIPTION OF THE DRAWINGS

The objects, characteristics, and advantages of the present invention will be described with more details in the following description of an exemplary embodiment of a transistor according to the invention, given in a non-limiting way in conjunction with the accompanying drawings, among which.

DETAILED DESCRIPTION OF THE PREFERRED EMBODIMENT

Figure 3:
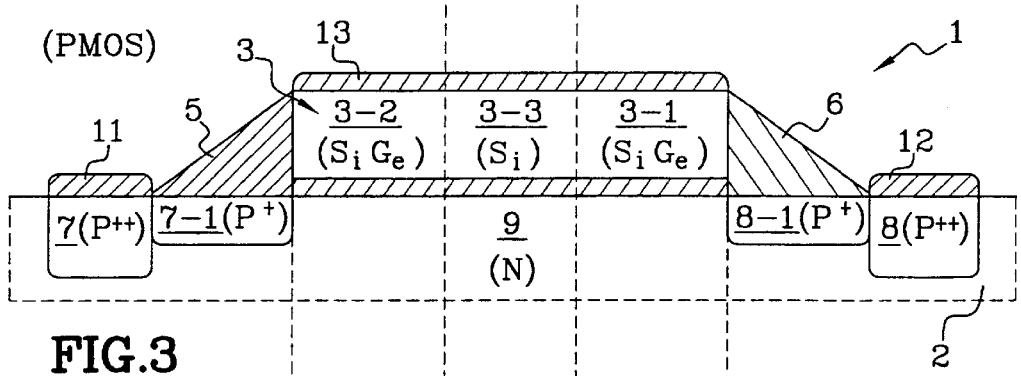
FIG. 3 is a schematic cross sectional view of a MOS transistor according to the invention.

FIG. 3 is a cross sectional schematic view of a transistor 1 according to the invention, whose structure is, per se, conventional. Transistor 1, here of the PMOS type, is designed in a lightly N-type silicon substrate 2. This substrate is, for example, an N-type well implanted in a single-crystal silicon wafer or a lightly doped epitaxial silicon layer. Gate 3, whose composition will be described later, lies on substrate 2 by means of a thin insulating layer 4, and comprises on its sides spacers 5 and 6 ensuring its electric insulation with regard to the regions of drain 7 and source 8. The regions of drain 7 and source 8, heavily doped ($P^{++}$), join the channel 9 present under gate 3 by means of lightly doped ($P^+$) drain and source extension regions 7-1, 8-1, or LDD regions ("Lightly Doped Drain"). Furthermore, the drain 7, the source 8 and the gate 3 are covered with a metalization layer forming electric contacts 11, 12, and 13.

According to the invention, the material forming the gate 3 of transistor 1 is a silicon-germanium alloy of the polycrystalline or amorphous type (agglomerate of crystals), having the particularity of a germanium percentage which is not homogeneous on the whole length of the gate 3. More particularly, the gate material comprises two side regions 3-1 and 3-2 presenting an increasing germanium percentage as the sides of the gate facing the regions of the drain 7 and 7-1 and source 8 and 8-1 become nearer. Optionally, depending on the length of gate 3, the gate material also comprises a central region 3-3 completely made of silicon, or made of silicon-germanium alloy $Si_{1-x}Ge_x$ having a stoichiometric coefficient "x" which is substantially constant and preferably much less than the coefficient "x" of the sides of the gate.

Still according to the invention, the extent of the side regions 3-1 and 3-2 is substantially constant whatever the length Lg of the gate may be (for a given gate fabrication process applied to a set of transistors), so that a long gate transistor according to the invention presents a central region 3-3 more extended than a short gate transistor. Ultimately, the two side regions 3-1 and 3-2 may meet together in a transistor with a very short gate, which will not have in this case a central region 3-3. It follows that a short gate according to the invention presents an average germanium percentage higher than a long gate.

Figure 4:
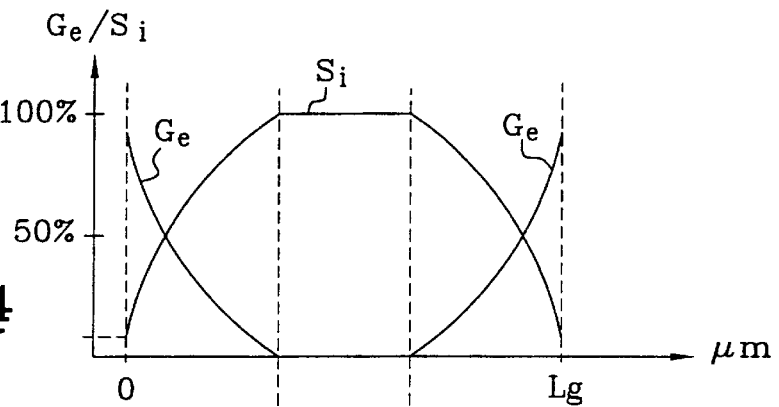
FIG. 4 shows the composition of the gate material of the transistor of FIG. 3.

To aid in better understanding, FIG. 4 shows a non-limiting example of gate material composition according to the invention. The central region 3-3 is here made of silicon and the side regions 3-2 and 3-3 comprise an increasing germanium percentage, ranging from 0% in the inside of the gate to 95% on the sides of the gate.

Figure 5:
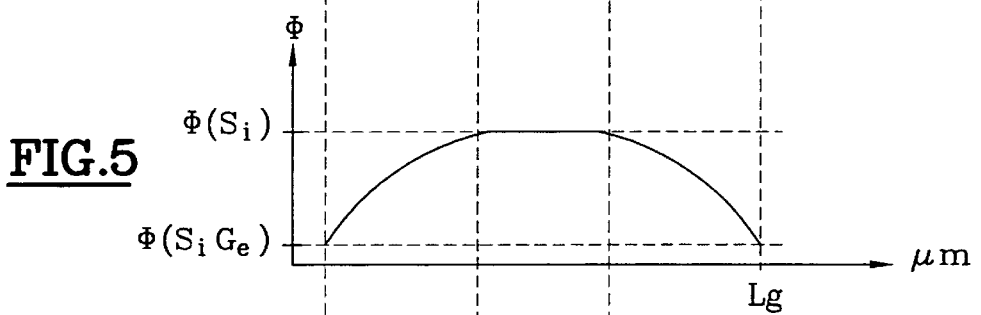
FIG. 5 is a graph representing the work function of the gate material of the transistor of FIG. 3.

Because of this variable germanium concentration profile, the work function Φ of the gate material is not constant along the gate of the transistor according to the invention. FIG. 5 shows that the work function Φ increases depending on the silicon concentration and decreases depending on the germanium concentration. At the two ends of the gate, germanium is in the majority and the work function of the gate material is practically equal to the germanium work function Φ(Ge). In the central region 3-3, on the contrary, silicon is in the majority and the work function of the gate material is equal or practically equal to the silicon work function Φ(Si). The graph of the work function versus the position along the gate is thus dome shaped, this graph being flat in the prior art.

Figure 6:
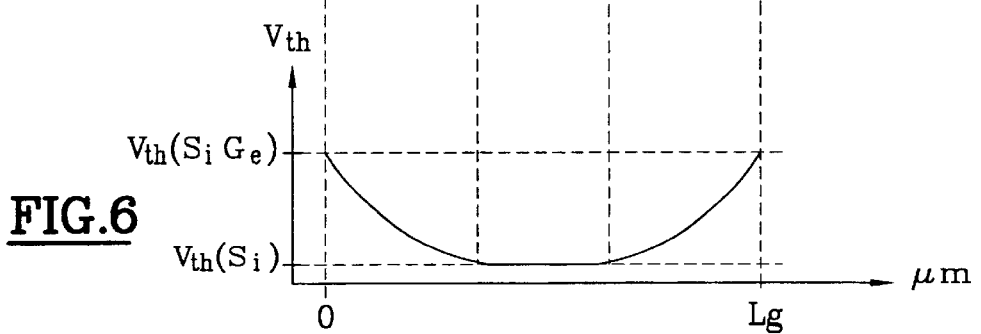
FIG. 6 is a graph representing the threshold voltage of the transistor of FIG. 3.

The threshold voltage Vth of a transistor PMOS being proportional to the work function of the gate material, as mentioned in the preamble, it follows that the threshold voltage Vth of the transistor according to the invention varies along the gate according to a graph illustrated in FIG. 6, which is the inverse of the graph of the work function. The average value, or macroscopic value, of the threshold voltage Vth of the transistor is thus defined by the area under the graph of FIG. 6 divided by the length of the gate Lg. It follows that the theoretical threshold voltage Vth is higher in a short gate transistor according to the invention, wherein the side regions 3-1 and 3-2 are predominant, than in a long gate transistor according to the invention, wherein the side regions 3-1 and 3-2 are short compared to the total length of the gate.

Figure 1:
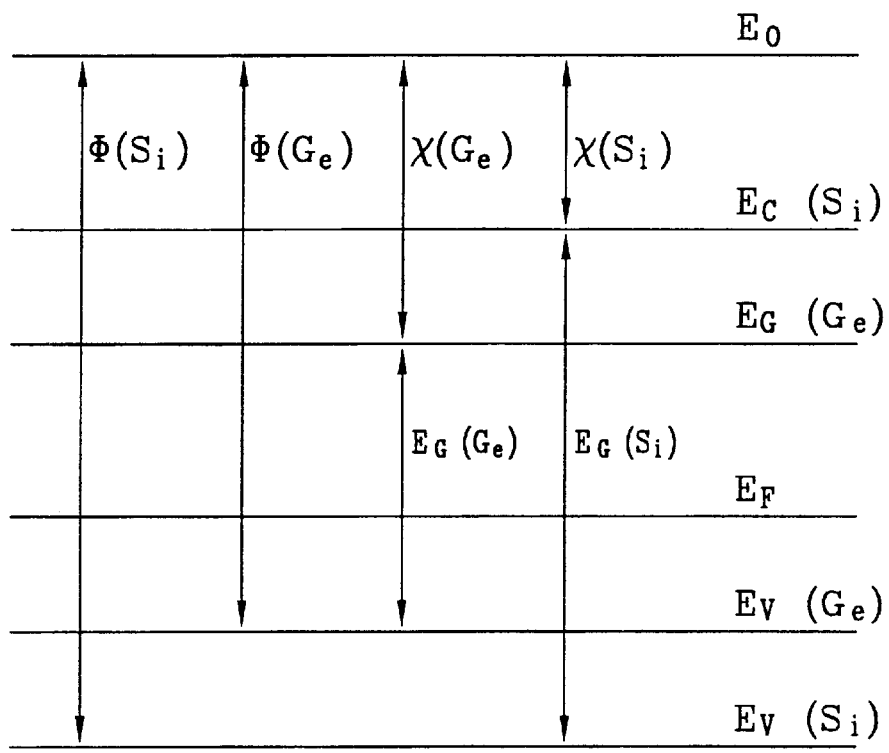
FIG. 1, previously described, shows the respective electronic properties of silicon and germanium.
Figure 2:
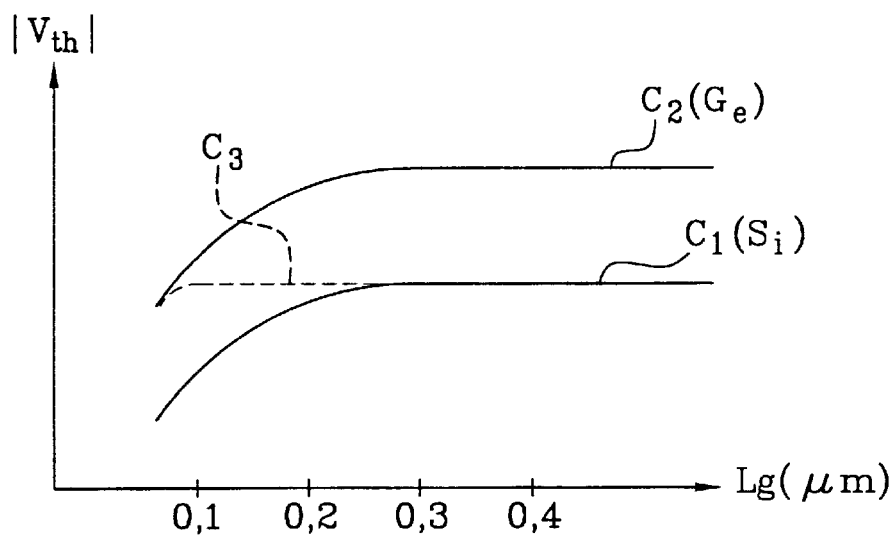
FIG. 2, previously cited, shows the variations of the threshold voltage Vth of a MOS transistor versus the length of the gate Lg, respectively for a silicon gate (graph C1), a germanium gate (graph C2), and a gate according to the invention (graph C3)

According to the invention, such an increase of the threshold voltage Vth, when the length of the gate Lg decreases, allows compensation for the short channel effect, whose influence rises when the length of the gate Lg decreases, because of the predominance of the space charge regions in the channel. Thus, as shown with a dotted line in FIG. 2, the transistor presents a graph Vth=f(Lg), indicated by C3, which is substantially flat. This graph C3 is near the graph C1 relating to silicon for long gates having a small germanium percentage, and is nearing the graph C2 relating to germanium for short gates having a high germanium percentage.

A method of manufacturing a gate of a MOS transistor according to the invention will now be described, in relation with FIGS. 7A to 7E.

Figure 7A:
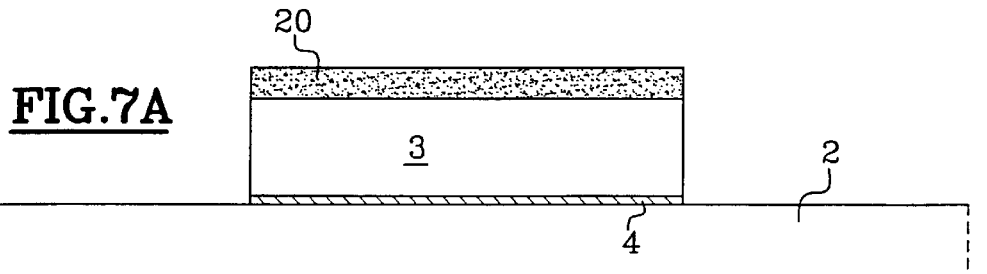
FIGS. 7A to 7E illustrate fabrication steps of a MOS transistor according to the invention.

In the step illustrated in FIG. 7A, a silicon gate 3 has been conventionally designed on a single crystal silicon substrate 2, the gate 3 having a conventional thickness in the order of 0.2 μm. The gate 3 has been formed on the substrate with interposition of a thin insulating layer 4, for example made of silicon oxide, with a thickness in the order of some nanometres. The steps of formation of gate 3 and layer 4 conventionally comprise a first step of growing an oxide layer 4, then a CVD deposition step ("Chemical Vapour Deposition") of a silicon layer of the polycrystalline or amorphous type (depending on the selected pressure and temperature conditions), and an etching step. The deposited silicon layer may possibly present a small germanium percentage, obtained by mixing germane to silane during its formation. Optionally but advantageously, the etching is performed by means of a silicon oxide hard mask 20, for example with a thickness of 20 nanometres, which covers the top of the gate 3 at the end of the etching process.

Figure 7B:
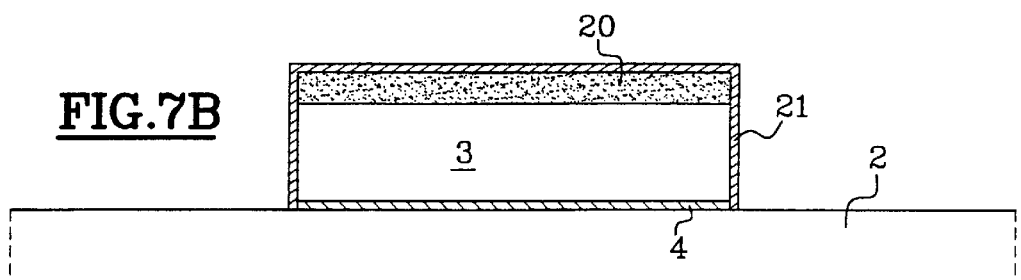

In the step illustrated in FIG. 7B, at least the sides of the gate are covered with a thin layer made of a protective material 21, with a thickness of some nanometres. This material 21 is selected for resistance to a solvent or to an etching agent of germanium used in a step described later. It is, for example, a silicon oxide layer obtained by cleaning the sides of the gate with hydrogen peroxide (side oxide), by means of the SAPI process known by the man skilled in the art, or obtained by a conventional thin oxide growing.

Figure 7C:
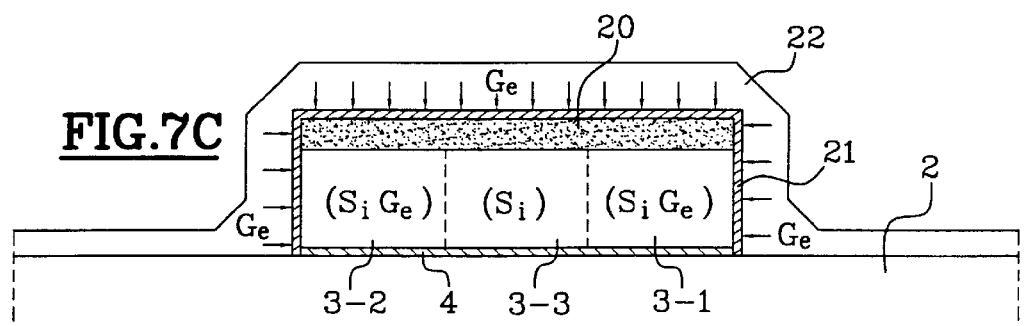

As illustrated in FIG. 7C, the gate 3 is then covered with a layer of polycrystalline germanium 22 formed by CVD deposition, with a sufficient thickness to totally cover at least the sides of the gate. In practice, this thickness is in the order of 0.2 to 1 μm according to the searched result during the following step. Still referring to FIG. 7C, the following step consists in applying a thermal annealing to the whole structure for diffusing the germanium of the layer 22 into the gate material 3, across the protection layer 21. This step allows the provision, on the sides of the gate, of a germanium percentage whose range may be from 10 to 100% according to the selected temperature and duration conditions, for example a temperature in the order of 850° C. during 30 to 60 minutes or a temperature in the order of 1000° C. during some tens of seconds (flash annealing RTA, or "Rapid Thermal Annealing"). At the end of this step, the gate material comprises the regions 3-1 and 3-2 described above, presenting an increasing germanium percentage towards the sides of the gate, and a central silicon region 3-3 which has not been reached by the germanium diffusion (but which may contain a constant germanium percentage introduced during the initial step of the gate formation).

If, during this step, the gate is not covered by the hard mask 20 (simple gate etching by means of a resin mask), the germanium also diffuses from the top of the gate towards the bottom of the gate. However, the essential object of the method according to the invention being to achieve a germanium concentration gradient in the lower part of the gate, near the oxide layer 4, a vertical diffusion of germanium which does not reach the lower part of the gate is not considered disturbing.

Figure 7D:
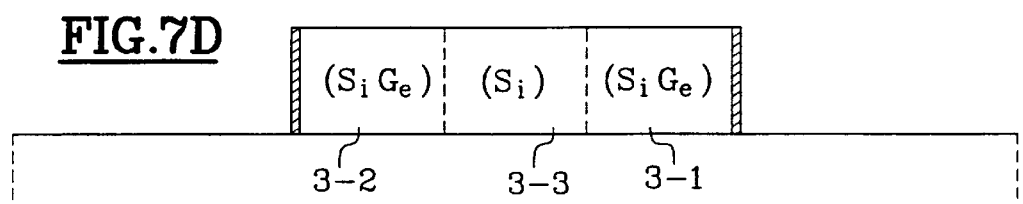

In the step of FIG. 7D, the germanium external layer 22 is removed or etched by any conventional means which does not corrode the protective material 21, in order to protect the germanium introduced by diffusion in the gate material 3. If the protective layer 21 is made of silicon oxide, as proposed above, the removal of the germanium layer 22 may be performed with water, hydrogen peroxide $H_2O_2$, diluted sulphuric acid $H_2SO_4$, diluted nitric acid $HNO_3$... or still by means of an oxygen plasma or a combination of these methods.

The hard mask 20 is then removed, preferably by anisotropic plasma etching to keep the protection material 21 on the sides of the gate 3. An additional and optional step of covering the gate by means of a material like silicon oxide, silicon nitride $Si_3N_4$ or silicon oxinitride SiON, may be then provided.

Figure 7E:
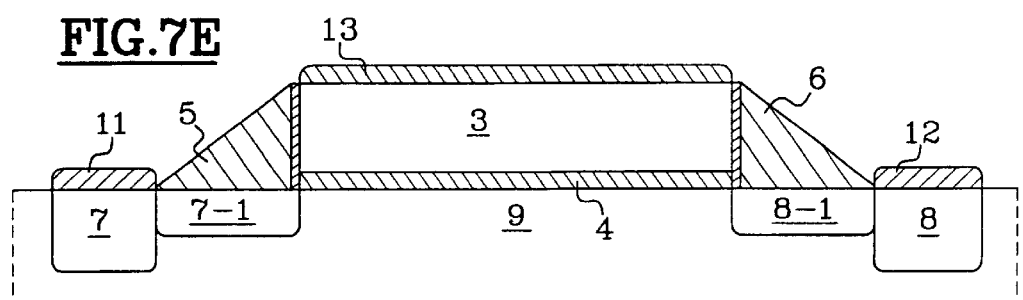

These steps being carried out, the conventional method of manufacturing a MOS transistor can be carried on in order to obtain the structure represented in FIG. 7E. When the silicon wafer comprises wells of the N-type (design of transistors PMOS) and P-type wells (design of transistor NMOS), this method comprises, for example, the following steps:

A) N-wells uncovered (P-wells masked): self-aligned implantation, on the gate sides, of the $P^+$ extension regions of drain 7-1 and source 8-1, B) P-wells uncovered (N-wells masked): self-aligned implantation, on the gate sides, of the $N^+$-type extension regions of drain 7-1 and source 8-1, C) formation of the spacers 5, 6 by depositing and etching an oxide or nitride layer on the wafer, D) N-wells uncovered (P-wells masked): self-aligned implantation, on the spacers 5 and 6, of the heavily doped $P^{++}$-type regions of drain 7 and source 8, leading to a $P^{++}$-type doping of the gates according to the invention, E) P-wells uncovered (N-wells masked): self-aligned implantation, on the spacers 5 and 6, of the heavily doped $N^{++}$ type regions of drain 7 and source 8, F) annealing at low temperature (about 800° C.) or flash annealing at high temperature (about 1000° C.) for redistributing the dopant atoms (this step may be performed at different moments of the fabrication process), G) depositing and etching one or more thin metalization layers (Metal 1, Metal 2,) with oxide interposition, in order to design the contacts 11, 12, and 13, and conductive tracks and pads of the integrated circuit.

It will be clearly understood by the man skilled in the art that the method according to the invention is susceptible to various implementation alternatives. Generally, the present invention opens a broad investigation field in the provided auto-compensation technique for the short channel effect. In practice, the properties of germanium are such that the present invention is preferably suitable for transistors of the type PMOS, as well as NMOS transistors having a P-type gate material.

What is claimed is:

1. A method of manufacturing an MOS transistor gate, including an initial step of forming an initial gate made of silicon or silicon-germanium alloy with a small germanium percentage, the initial gate having a top and external sides, the method comprising:

depositing a germanium external layer at least on said external sides of the initial gate;

applying, a thermal annealing cycle to the gate in order to diffuse germanium from the germanium external layer into the gate material through said external sides; and removing the germanium external layer.

2. The method according to claim 1, wherein the step of depositing the germanium external layer is preceded by a step of depositing, at least on the sides of the initial gate, a thin layer of a protection material at least resistant to a solvent or an etching agent of the germanium external layer without preventing diffusion of germanium from the germanium external layer into the gate material.

3. The method according to claim 2, wherein the protection material is silicon oxide.

4. The method according to claim 1, wherein the germanium external layer is removed according to one of the following processes:

cleaning with water;

cleaning with hydrogen peroxide;

cleaning with sulfuric acid;

removal by oxygen plasma; and a combination of the above processes.

5. The method according to claim 1, wherein:

the initial gate is formed by etching a layer of gate material by means of a hard mask made of silicon oxide;

the hard mask is left over the top of the gate during the germanium diffusion step; and the hard mask is removed from the gate after the germanium diffusion.

6. The method according to claim 1, further comprising:

doping the initial gate by means of P-type dopant atoms.

7. The method according to claim 1, wherein, after removal of the germanium external layer, the gate includes side regions presenting an increasing germanium percentage towards the sides of the gate.

8. The method according to claim 7, wherein, after removal of the germanium external layer, the gate includes a silicon central region comprising no germanium or a constant percentage of germanium.

9. The method according to claim 7, wherein the side regions comprise a maximal germanium percentage ranging from 10% to 100% on the sides of the gate.

10. The method according to claim 7, wherein a length of the side regions is independent of a length of the gate.

* * * * *

UNITED STATES PATENT AND TRADEMARK OFFICE
CERTIFICATE OF CORRECTION

PATENT NO. : 6,528,399 B1
DATED : March 4, 2003
INVENTOR(S) : Jerome Alieu, Caroline Hernadez and Michel Haond It is certified that error appears in the above-identified patent and that said Letters Patent is hereby corrected as shown below:

Column 5,
Lines 48 and 49, delete "." before "during";

Column 6,
Line 37, delete "type" and replace with -- -type --.

Signed and Sealed this

Seventeenth Day of January, 2006

JON W. DUDAS
*Director of the United States Patent and Trademark Office*